(12) United States Patent
Huppert et al.

(10) Patent No.: US 6,365,480 B1
(45) Date of Patent: Apr. 2, 2002

(54) IC RESISTOR AND CAPACITOR FABRICATION METHOD

(75) Inventors: Gilbert L. Huppert, Stoneham; Michael D. Delaus, Andover; Edward Gleason, Lexington, all of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/825,386

(22) Filed: Apr. 3, 2001

Related U.S. Application Data

(60) Provisional application No. 60/253,470, filed on Nov. 27, 2000.

(51) Int. Cl.$^7$ .............................................. H01L 21/20
(52) U.S. Cl. ...................... 438/381; 438/240; 438/622; 438/706; 438/957
(58) Field of Search .............................. 438/381, 382, 438/384, 240, 261, 329, 330, 385, 622, 706, 957, 656

(56) References Cited

U.S. PATENT DOCUMENTS

| | | | |
|---|---|---|---|
| 3,996,551 A | 12/1976 | Croson | 338/309 |
| 4,878,770 A | 11/1989 | Ruggierio et al. | 388/308 |
| 4,975,386 A | * 12/1990 | Rao | |
| 5,043,295 A | 8/1991 | Ruggerio et al. | 438/384 |
| 5,479,316 A | 12/1995 | Smrtic et al. | 361/322 |
| 5,926,359 A | 7/1999 | Greco et al. | 361/311 |

* cited by examiner

Primary Examiner—Tuan H. Nguyen
Assistant Examiner—Yennhu B. Huynh
(74) Attorney, Agent, or Firm—Koppel & Jacobs

(57) ABSTRACT

An IC resistor and capacitor fabrication method comprises depositing a dielectric layer over existing active devices and metal interconnections on an IC substrate. In a preferred embodiment, a layer of thin film material suitable for the formation of thin film resistors is deposited next, followed by a metal layer that will form the bottom plates of metal-dielectric-metal capacitors. Next, the capacitors' dielectric layer is deposited to a desired thickness to target a particular capacitance value, followed by the deposition of another metal layer that will form the capacitors' top plates. The metal layers, the capacitor dielectric layer, and the thin film material layer are patterned and etched to form TFRs and metal-dielectric-metal capacitors as desired on the IC substrate. The method may be practiced using any of several alternative process sequences. For example, the bodies of the TFRs can be formed before the deposition of the capacitors' layers. Also, the capacitors' bottom plates may be patterned and etched prior to doing the same for their top plates.

26 Claims, 9 Drawing Sheets

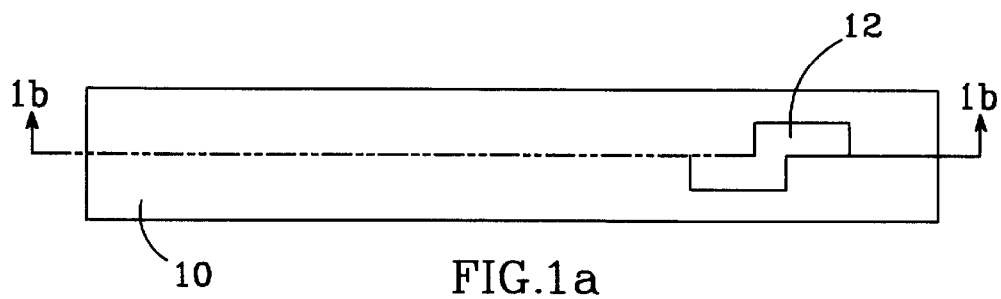
FIG.1a
FIG.1b
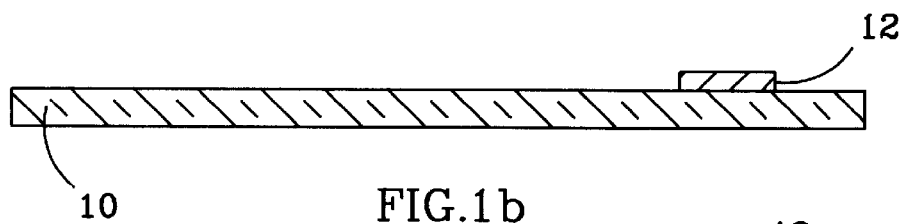
FIG.2a
FIG.2b
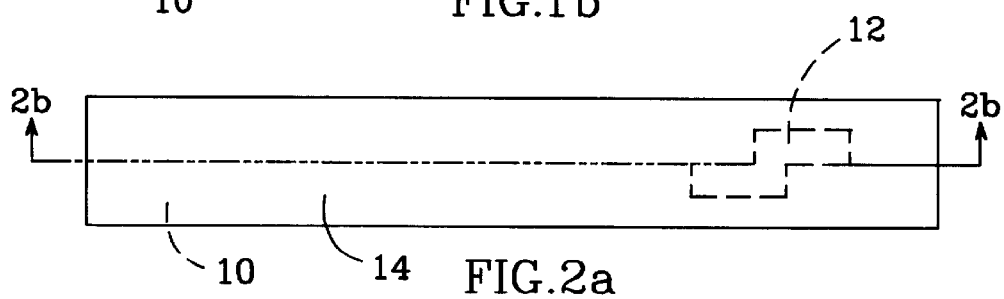
FIG.3a
FIG.3b

IC RESISTOR AND CAPACITOR FABRICATION METHOD

This application claims the benefit of provisional patent application No. 60/253,470 to Huppert et al., filed Nov. 27, 2000.

BACKGROUND OF THE INVENTION

1. Field of the Invention

This invention relates to the field of integrated circuit (IC) fabrication, and particularly to the fabrication of capacitors and thin film resistors on a common substrate.

2. Description of the Related Art

The ability to integrate high accuracy passive components such as resistors and capacitors with active devices has become increasingly important. Capacitors having a poly-oxide-poly structure have traditionally been employed in this context, because they are simple and inexpensive to fabricate. Unfortunately, the capacitance value of such devices varies significantly with applied voltage, and their inherently high resistance and parasitic capacitance components make them unsuitable for many high performance analog circuits.

A capacitor having a metal-oxide-metal structure avoids these deficiencies, and can in general be placed further from the supporting substrate, thereby lowering the parasitic capacitive components. For manufacturing efficiency, one level of interconnect metal is typically incorporated as either the top or bottom plate of the capacitor. However, this technique can lower the effectiveness of the capacitor, due to limitations imposed on the metal etch used for the top and/or bottom plates.

Similar problems are encountered when integrating resistors. Polysilicon resistors are simple and inexpensive to fabricate, but their resistance values vary with applied voltage and temperature, they exhibit high parasitic capacitance, and often have poor matching characteristics. Thin film resistors formed from metal or metal combinations have been formed to overcome these shortcomings. Such resistors are generally integrated with one of the metal interconnect levels to improve manufacturing efficiency. Unfortunately, this can lead to degradation in the resistors' matching characteristics due to the metal thickness dictated by the interconnect level, or due to the irreproducibility of the dimensions of each resistor's active opening in the metal when it is cleared to expose the resistor.

SUMMARY OF THE INVENTION

An IC resistor and capacitor fabrication method is presented which overcomes the problems noted above, providing high performance thin film resistors and metal-dielectric-metal capacitors on a common substrate.

In accordance with one embodiment of the present method, an IC's active devices and a metal interconnect level are fabricated on a substrate. A dielectric layer is deposited over these structures, which protects them from the subsequent process steps required to form the resistors and capacitors. A layer of thin film material suitable for the formation of thin film resistors (TFRs) is deposited next, followed by a metal layer that will form the bottom plates of the metal-dielectric-metal capacitors. Next, the capacitors' dielectric layer is deposited to a desired thickness to target a particular capacitance value, followed by the deposition of another metal layer that will form the capacitors' top plates. The metal layers, the capacitor dielectric layer, and the thin film material layer are patterned and etched to form TFRs and metal-dielectric-metal capacitors as desired on the IC substrate.

The method may be practiced using any of several alternative process sequences. For example, the bodies of the TFRs can be formed before the deposition of the capacitors' layers. Also, the capacitors' bottom plates may be patterned and etched prior to doing the same for their top plates.

Further features and advantages of the invention will be apparent to those skilled in the art from the following detailed description, taken together with the accompanying drawings.

BRIEF DESCRIPTION OF THE DRAWINGS

FIGS. 1a–7a are plan views depicting the fabrication of a TFR and capacitor in accordance with the present method.

FIGS. 1b–7b are cross-sectional views, corresponding to the plan views of FIGS. 1a–7a, respectively, depicting the fabrication of a TFR and capacitor in accordance with the present method.

FIGS. 8a–12a are plan views depicting the fabrication of a TFR and capacitor in accordance with an alternative embodiment of the present method.

FIGS. 8b–12b are cross-sectional views, corresponding to the plan views of FIGS. 8a–12a, respectively, depicting the fabrication of a TFR and capacitor in accordance with an alternative embodiment of the present method.

FIGS. 13a–16a are plan views depicting the fabrication of a TFR and capacitor in accordance with an alternative embodiment of the present method.

FIGS. 13b–16b are cross-sectional views, corresponding to the plan views of FIGS. 13a–16a, respectively, depicting the fabrication of a TFR and capacitor in accordance with an alternative embodiment of the present method.

FIGS. 17a–19a are plan views depicting the fabrication of a TFR and capacitor in accordance with an alternative embodiment of the present method.

FIGS. 17b–20b are cross-sectional views, corresponding to the plan views of FIGS. 17a–20a, respectively, depicting the fabrication of a TFR and capacitor in accordance with an alternative embodiment of the present method.

DETAILED DESCRIPTION OF THE INVENTION

Figure 4A:
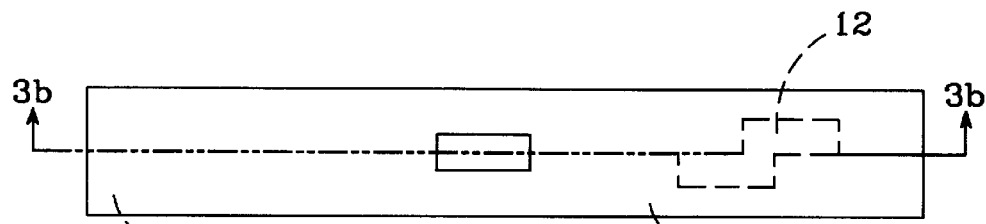

A method of fabricating high performance thin film resistors and capacitors on a common substrate is illustrated in the process sequence depicted in FIGS. 1a–7a (plan views) and 1b–7b (corresponding cross-sectional views). For clarity, the sequence shows the formation of one TFR and one capacitor; however, in practice, the described method is likely to be employed to fabricate numerous TFRs and capacitors with a common set of process steps.

Prior to practicing the present method, an IC's active devices and at least one metal interconnect level are fabricated. For example, in FIGS. 1a and 1b, a portion of a substrate 10 supports a metal interconnect 12, which is connected to one or more active devices (not shown). As shown in FIGS. 2a and 2b, a dielectric layer 14 is deposited atop these existing structures. Layer 14 serves to protect the existing structures from the remaining process steps, as well as isolating the TFR and capacitor from the existing metal.

In a preferred embodiment, the remaining layers required for the TFR and capacitor are deposited after the deposition of dielectric layer 14; this is shown in FIGS. 3a and 3b. A high resistivity film 16 from which the TFR will be made is deposited on layer 14, followed by a layer of metal 18 which will be used to form the bottom plate of the capacitor. The capacitor dielectric layer 20 is deposited next, with the thickness of the layer chosen to provide a particular capacitance value. Another metal layer 22 is deposited on the capacitor dielectric, which will be used to form the top plate of the capacitor.

Figure 4B:
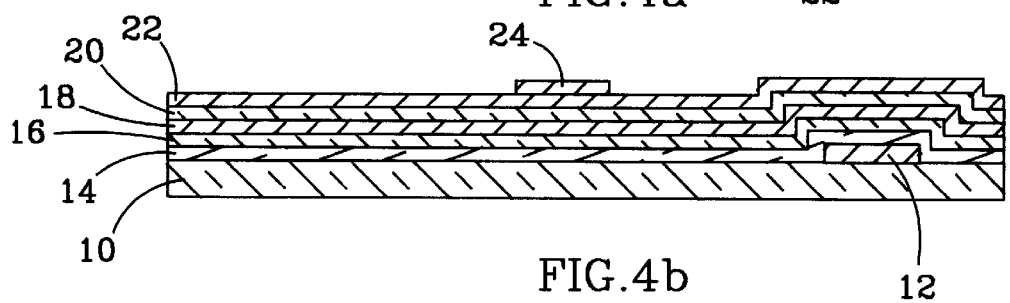
Figure 5A:
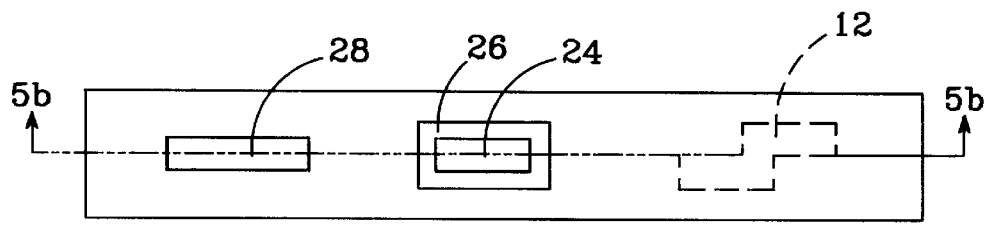
Figure 5B:
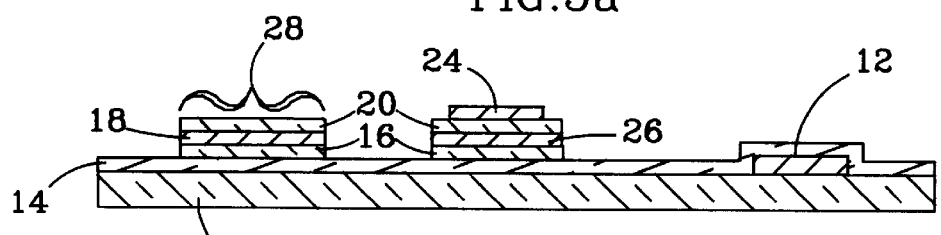

With the necessary material layers in place, the desired TFR and capacitor structures are now formed. In FIGS. 4a and 4b, the top plate 24 of the capacitor is patterned and etched. The masking layer is then removed. In FIGS. 5a and 5b, the bottom plate 26 and TFR body 28 are patterned and etched, with those portions of thin film layer 16, metal layer 18, and dielectric layer 20 removed from areas which will not define resistors or capacitors. The capacitor's bottom plate stack can be etched with almost any combination of wet and dry etches.

Figure 6A:
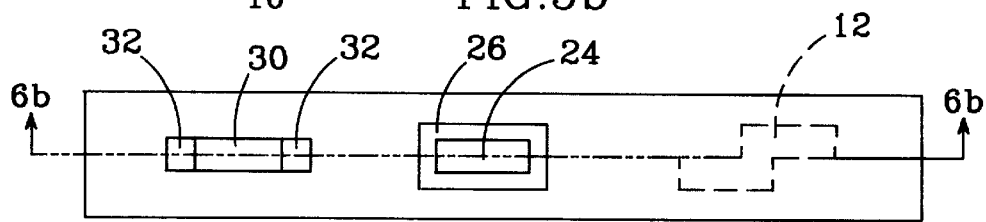
Figure 6B:
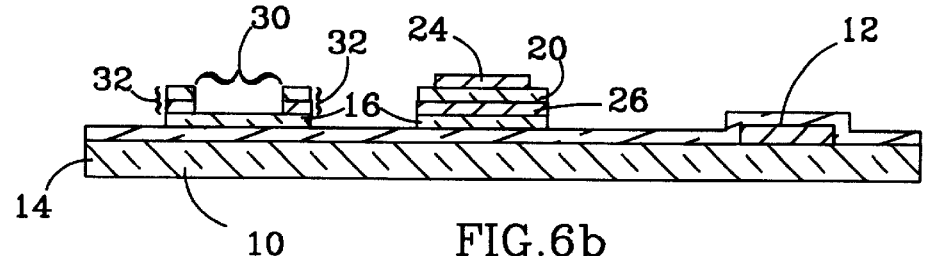

In FIGS. 6a and 6b, the active opening 30 which defines the TFR's length is patterned and etched. This removes the capacitor dielectric 20 and bottom plate metal 18 from above the area of the TFR body 28, except for "endcaps" 32 which are left at the TFR ends.

Figure 7A:
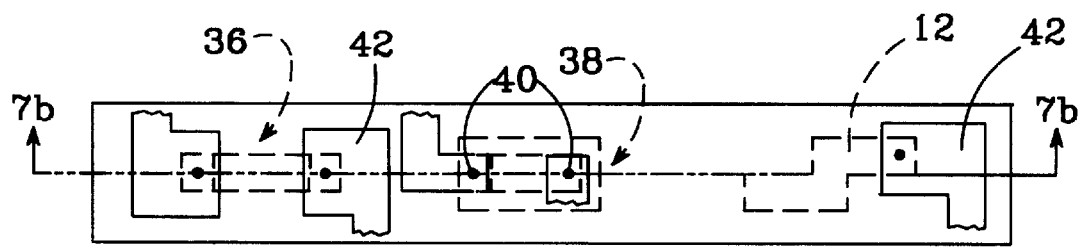
Figure 7B:
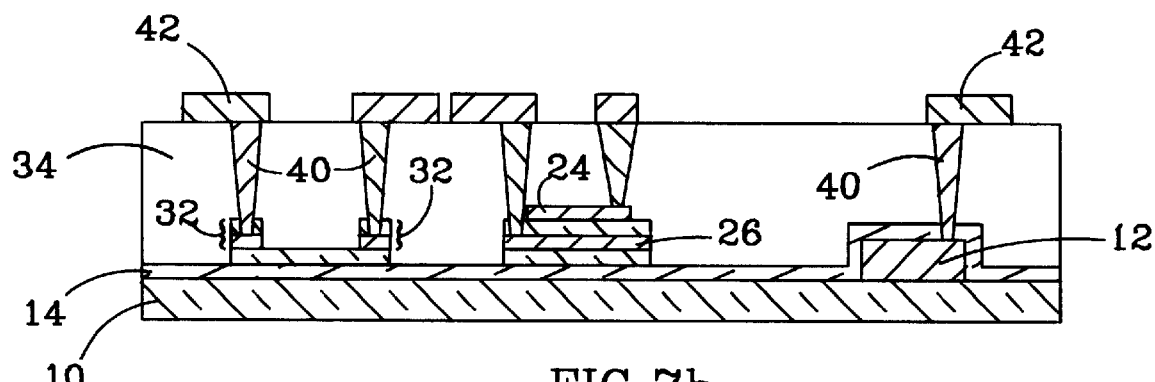

The completion of the process is shown in FIGS. 7a and 7b. An inter-metal dielectric layer 34 is deposited over the TFR (36) and capacitor (38) structures, vias 40 are formed to provide contacts to the TFR and capacitor, and a metal layer 42 is deposited, patterned and etched to interconnect the TFR and capacitor to the other IC circuitry.

Substrate 10 is typically silicon, and the IC's transistors and a metallization level are completed using well-known processes prior to commencing the present method. Dielectric layer 14 is preferably plasma-enhanced chemical vapor deposition (PECVD) oxide, having a thickness of 1000–6000 Å. The thin film material 16 is preferably silicon-chromium-carbon ($Si_xCr_yC_z$) having a sheet resistance of 50–3000 ohms/square, which is sputter deposited and optionally annealed. Bottom plate metal 18 is preferably titanium-tungsten (TiW) having a thickness of 500–3000 Å, which is sputter deposited after an appropriate surface cleaning procedure. The bottom plate material should be chosen so as not to react with either the thin film material 16 or the capacitor dielectric layer 20.

Capacitor dielectric layer 20 is preferably PECVD oxide having a thickness of 200–1500 Å. Good control of this thickness is critical to achieving a desired capacitance value. When dielectric layer 20 is oxide, the resulting capacitor is referred to as a metal-oxide-metal capacitor (MOMCAP). Top plate metal 22 preferably comprises a composite stack of TiW and an aluminum-copper (Al—Cu) alloy. The TiW is preferably sputter deposited to a thickness of 500–3000 Å, and the Al—Cu alloy is preferably sputtered—in a high-vacuum system without being exposed to the atmosphere—to a thickness of 1000–7000 Å. The use of this composite stack gives the top plate a low resistivity, as well as providing symmetry to the capacitor.

The capacitor's top plate 24 is patterned using standard photolithographic techniques. Due to the sensitivity of the capacitor to the loss of dielectric material around the active top plate area, top plate metal 22 is preferably wet etched in a 2 step process. Wet etching is preferred due its higher selectivity with respect to the capacitor's dielectric layer. Wet etching is enabled because 1)the (preferred) top plate metal is the TiW and Al—Cu alloy stack, and 2)because the capacitor's top plate is separate from the metal interconnects under dielectric layer 14, such that no fine features need to be maintained. When the top plate etch is complete, the photoresist is removed using standard dry resist strip processing.

The bottom plate masking layer preferably fully encloses the top plate pattern. The bottom plate and TFR body are preferably etched using a multi-step etch process in a single dry etch tool, which should provide an excellent pattern transfer. Alternatively, the capacitor dielectric can first be etched in a standard $CF_4/CHF_3$ plasma, the bottom plate's TiW etched in hot $H_2O_2$, and the thin film dry etched in either a standard $Cl_2$ and $O_2$ chemistry or a standard $SF_6$ chemistry. The photo pattern is then removed using standard dry resist strip processing.

The etching of the TFR's active opening preferably comprises dry etching dielectric layer 20 using standard $CF_4/CHF_3$ plasma, and etching metal layer 16 using hot $H_2O_2$. Note that since only the length of the resistor is defined in this step, this last mask is not sensitive to misalignment in either the length or width dimensions of the TFR. The photoresist is preferably removed using a wet chemical stripper, since the thin film material can be sensitive to exposure to dry stripping processes.

Inter-metal dielectric layer 34 is preferably PECVD oxide, planarized using either a spin-on glass etch back step or with chemical-mechanical polishing (CMP). The vias are patterned and etched down to stop on three different levels: the capacitor top plate, the capacitor bottom plate and the TFR end caps, and the metal level found below dielectric layer 14.

Note that the present process does not preclude the use of an alternative metal process, such as using copper as the interconnect metal, or using dual-damascene metal patterning.

Though TiW and an Al—Cu alloys are identified as preferred metals, the present method is not limited to these materials. Rather, the top and bottom plates can comprise any metals capable of being wet-etched.

Figure 8A:
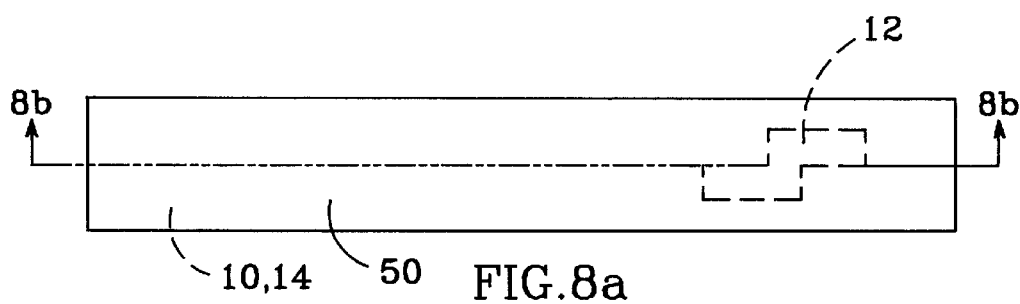
Figure 8B:
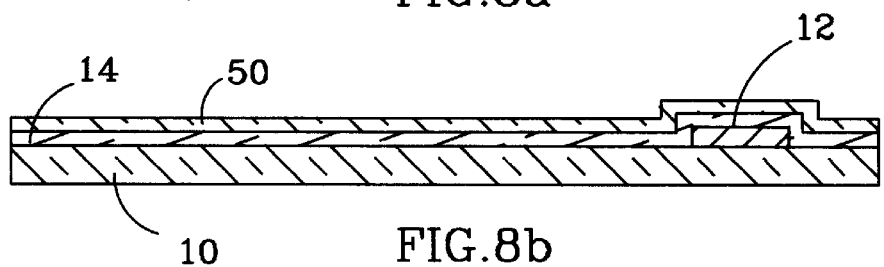
Figure 9A:
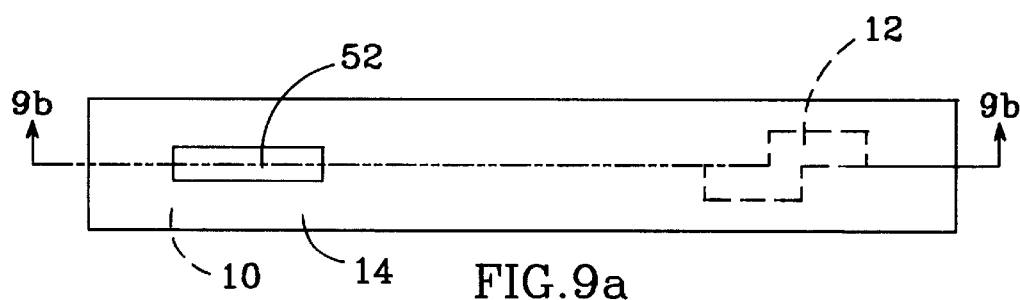
Figure 9B:
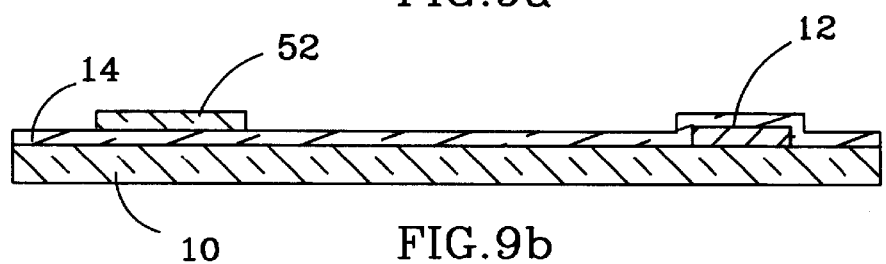
Figure 10A:
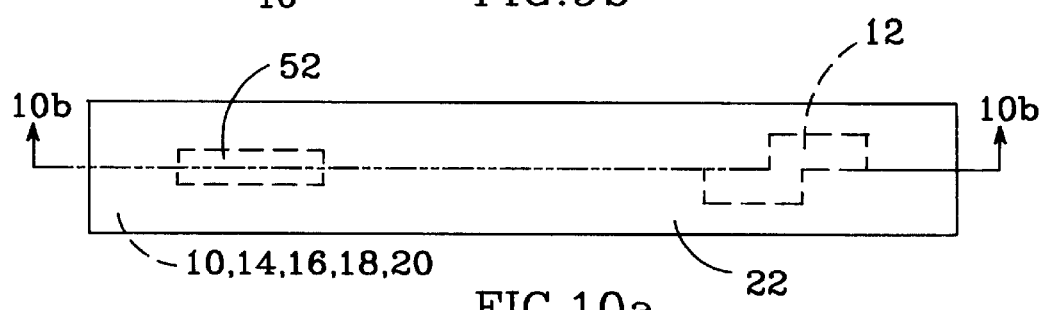
Figure 10B:
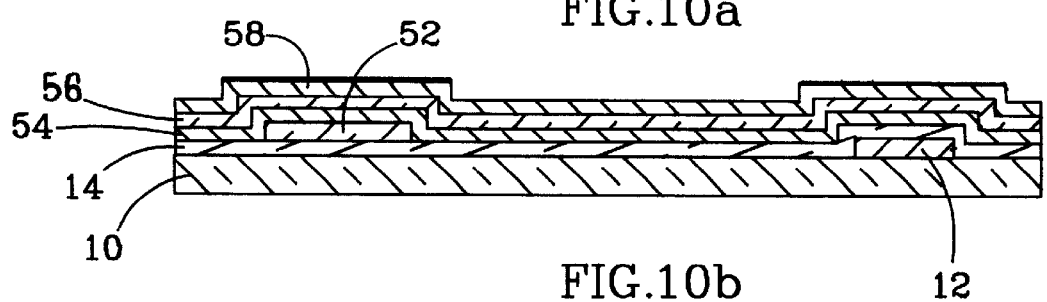

An alternate process sequence is shown in FIGS. 8a–11a (plan views) and FIGS. 8b–11b (corresponding cross-sectional views), in which the TFR is patterned and etched prior to the deposition of the capacitor layers. The sequence starts as described above and as shown in FIGS. 1 and 2: a protective dielectric layer 14 is deposited over existing active devices and metallization 12 fabricated on a substrate 10. Then, as shown in FIGS. 8a and 8b, a layer of thin film material 50 is deposited over dielectric layer 14. In FIGS. 9a and 9b, thin film material 50 is patterned and etched to form the TFR body 52. This is followed by the deposition of the capacitor's bottom plate metal 54, dielectric layer 56, and top plate metal 58, as shown in FIGS. 10a and 10b.

Figure 11A:
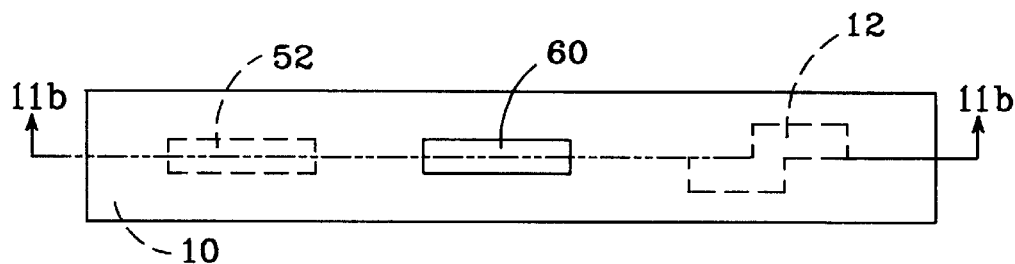
Figure 11B:
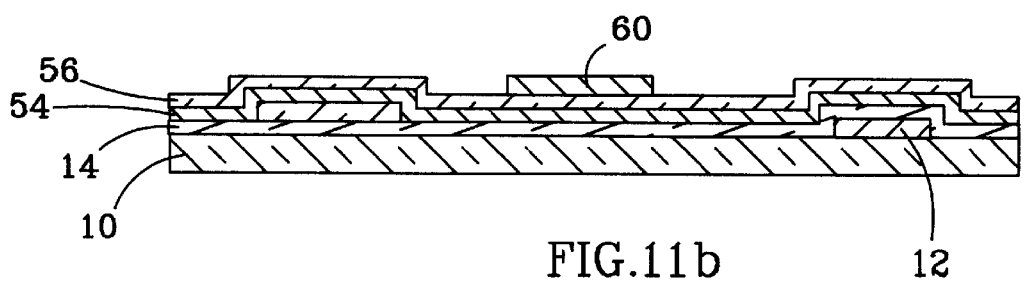
Figure 12A:
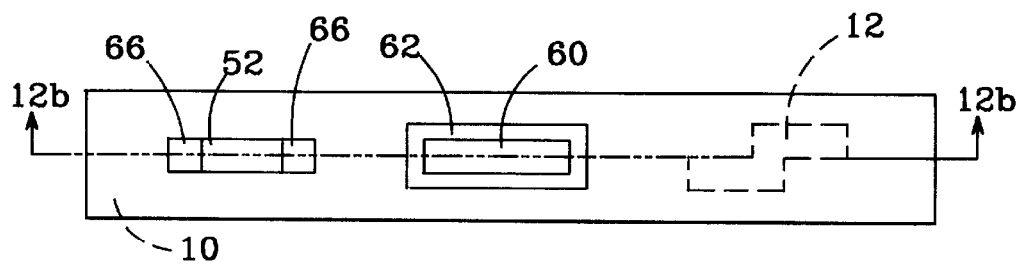
Figure 12B:
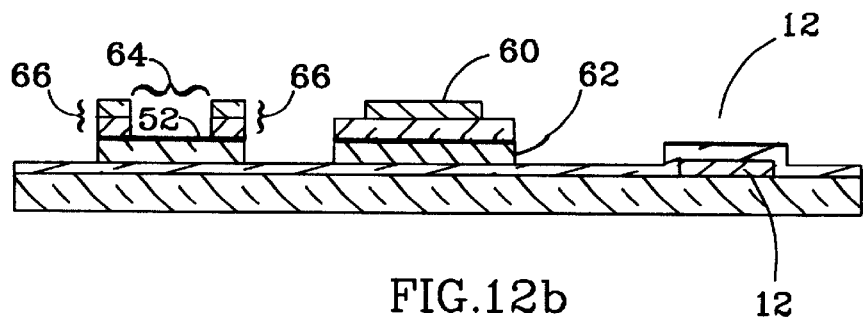

In FIGS. 11a and 11b, the capacitor top plate 60 is patterned and etched from metal layer 58, followed by the patterning and etching of the capacitor's bottom plate 62 and the TFR's active opening 64 as shown in FIGS. 12a and 12b, leaving TFR endcaps 66. The process is completed as described above and as shown in FIGS. 7a and 7b: an inter-metal dielectric layer is deposited, vias are formed, and a metal interconnect layer is deposited, patterned, and etched to interconnect the TFR and capacitor to the other IC circuitry.

With this process sequence, the capacitor top plate can be wet-etched as described above, while the capacitor bottom plate can be patterned and etched using a standard $CF_4/CHF_3$ plasma, with the bottom plate and TFR active opening etched in hot $H_2O_2$. This sequence can lead to higher precision resistor matching, since the very thin resistor material is patterned and etched separately.

Note that, in accordance with this alternative process sequence, it is also possible to deposit and etch the capacitor's top plate after its bottom plate has been etched. However, this can lead to a slight degradation in the matching performance of the resistors since the bottom plate metal will be exposed to the $H_2O_2$ during both the top and bottom plate etches.

Figure 13A:
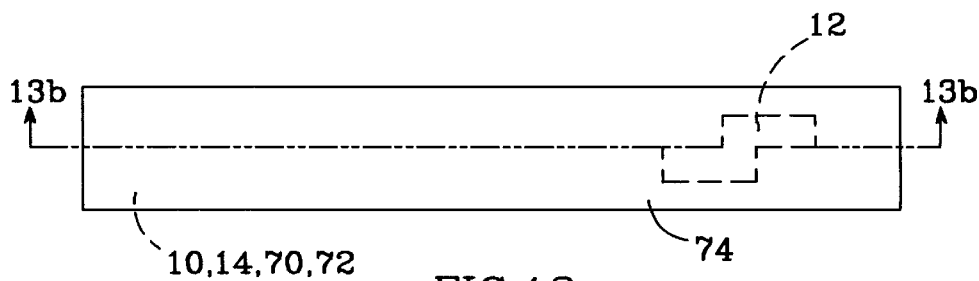
Figure 13B:
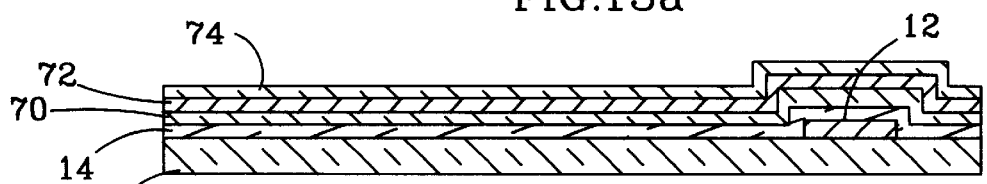
Figure 14A:
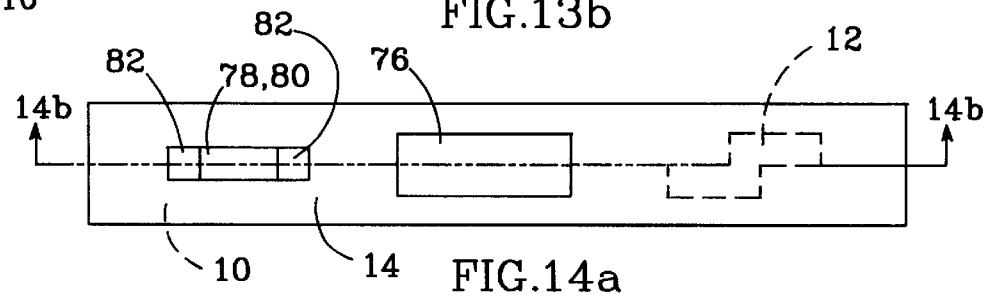
Figure 14B:
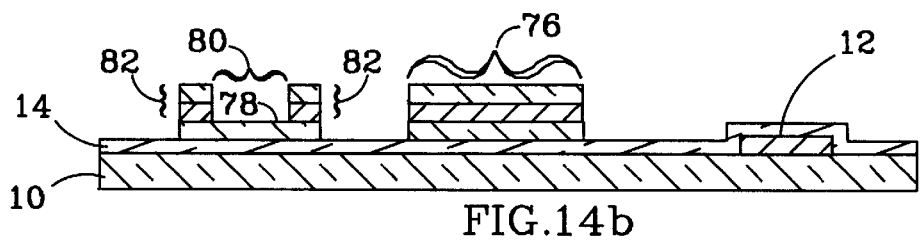

Another alternative process sequence allows the capacitor bottom plate to be formed prior to the formation of the top plate. This approach is illustrated in FIGS. 13a–16a (plan views) and 13b–16b (corresponding cross-sectional views). The method begins as shown in FIGS. 1 and 2: with the deposition of a dielectric layer 14 over the active device and metallization structures already formed on substrate 10. As shown in FIGS. 13a and 13b, this is followed by the deposition of a thin film material layer 70, a bottom plate metal layer 72, and a capacitor dielectric layer 74. The bottom plate 76 of the capacitor and the body 78 of the TFR are patterned and etched next, followed by the patterning and etching of the TFR's active opening 80 and endcaps 82; the results of these steps are as shown in FIGS. 14a and 14b.

Figure 15A:
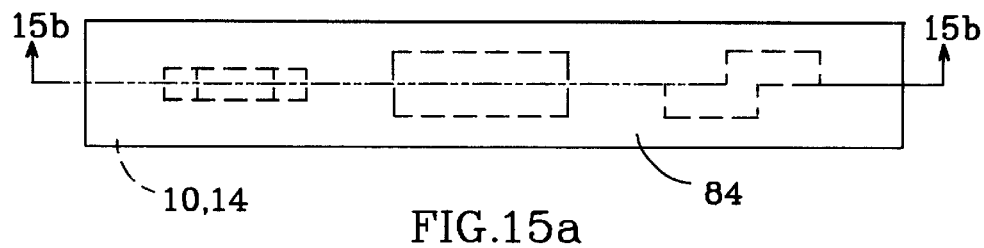
Figure 15B:
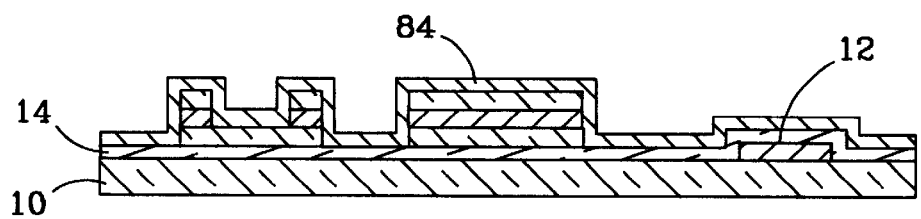
Figure 16A:
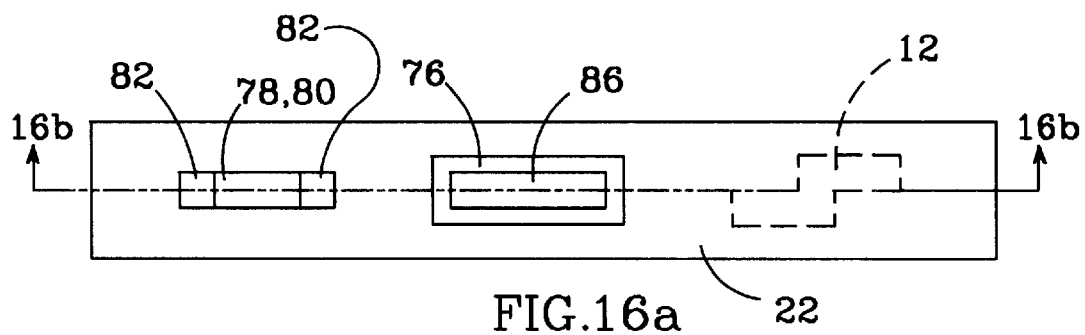
Figure 16B:
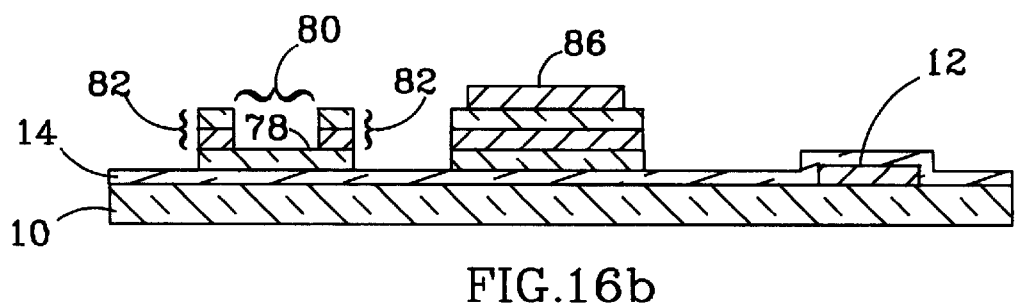

The top plate metal layer 84 is deposited next, as shown in FIGS. 15a and 15b. Then, in FIGS. 16a and 16b, the capacitor's top plate 86 is patterned and etched. The process continues as shown in FIGS. 7a and 7b, with the formation of an inter-metal dielectric layer, vias, and a metal interconnect level.

Figure 17A:
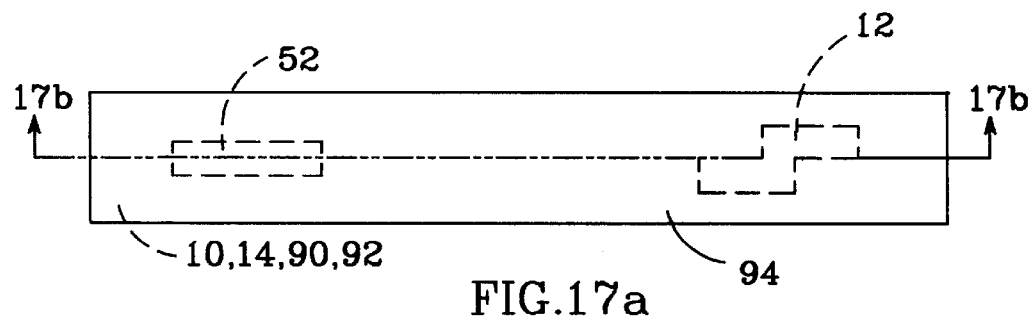
Figure 17B:
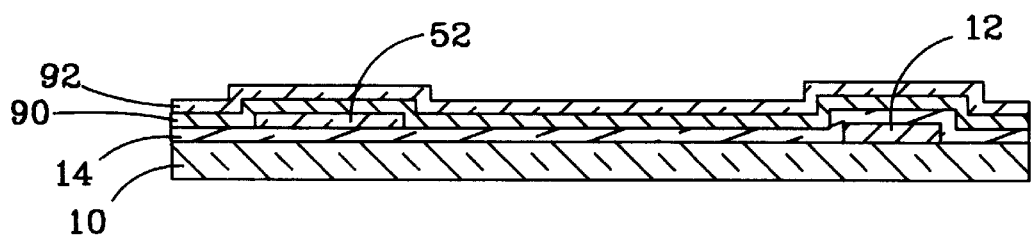

Another possible process sequence in accordance with the present invention is illustrated in FIGS. 17a–20a (plan views) and 17b–20b (corresponding cross-sectional views). The process begins in accordance with FIGS. 1, 2, 8 and 9: with a dielectric layer 14 deposited over existing active devices and metallization formed on a substrate 10, followed by the deposition of a thin film material layer 50 which is patterned and etched to form the body 52 of a TFR. As shown in FIGS. 17a and 17b, this is followed by depositing a first layer of metal 90 over the TFR body and dielectric layer 14, and depositing a second dielectric layer 92 over metal layer 90.

Figure 18A:
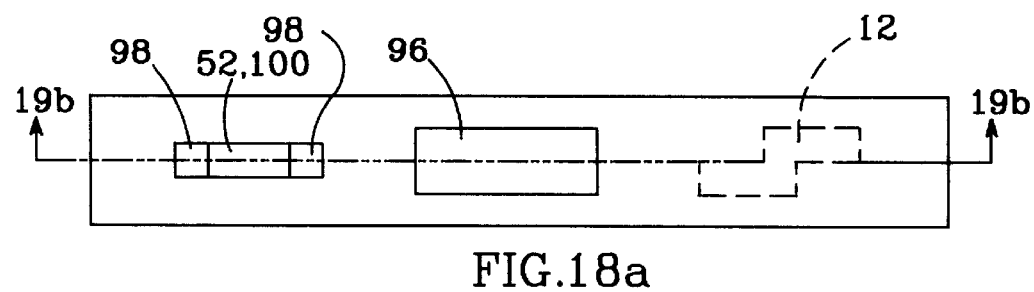
Figure 18B:
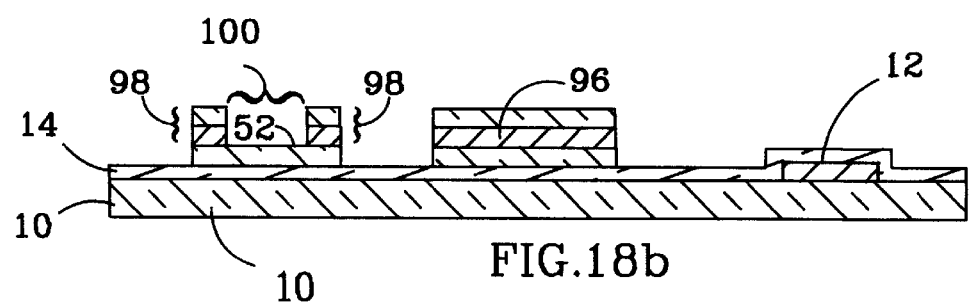
Figure 19A:
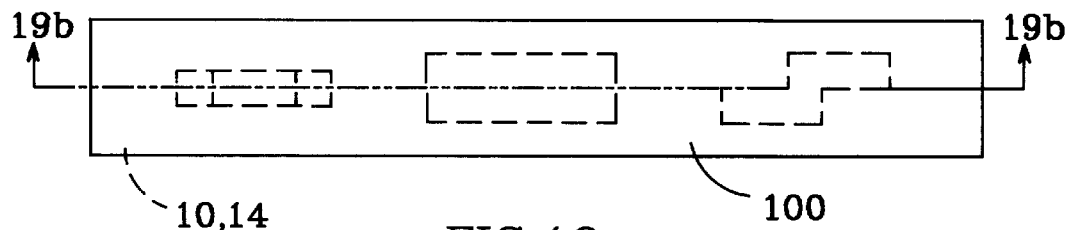
Figure 19B:
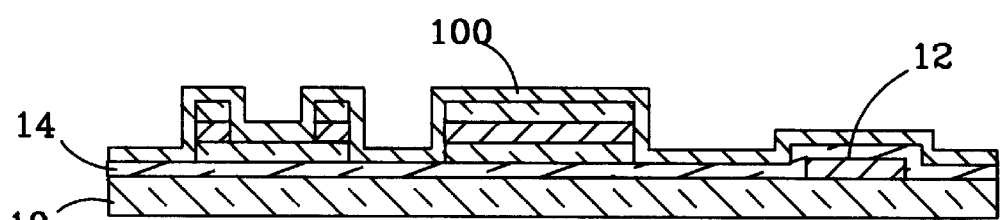
Figure 20A:
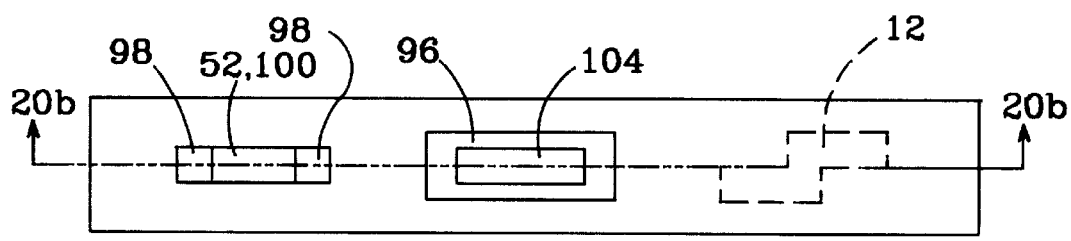
Figure 20B:
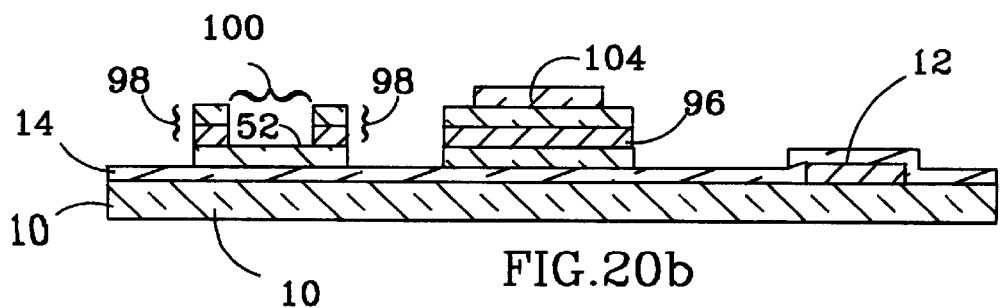

In FIGS. 18a and 18b, the bottom plate 96 of the capacitor, the TFR's endcaps 98, and the TFR's active opening 100, are patterned and etched from layers 90 and 92. A layer of metal 102 is deposited in FIGS. 19a and 19b, from which the capacitor's top plate 104 is patterned and etched in FIGS. 20a and 20b. The process is completed in the same way as those described above: as shown in FIGS. 7a and 7b, with the formation of an inter-metal dielectric layer, vias, and a metal interconnect level.

While particular embodiments of the invention have been shown and described, numerous variations and alternate embodiments will occur to those skilled in the art. Accordingly, it is intended that the invention be limited only in terms of the appended claims.

We claim:

1. A method of fabricating a thin film resistor (TFR) and a capacitor on a common integrated circuit (IC) substrate, comprising:

depositing a first dielectric layer over existing active device and metal interconnect structures on an IC substrate, depositing a layer of thin film material on said first dielectric layer, depositing a first layer of metal on said thin film material layer, depositing a second dielectric layer over said first layer of metal, depositing a second layer of metal on said second dielectric layer, and patterning and etching said first and second layers of metal, said second dielectric layer, and said thin film material layer to form a TFR having two endcaps and a metal-dielectric-metal capacitor having top and bottom plates on said IC substrate, said first layer of metal providing said TFR's endcaps and said capacitor's bottom plate.

2. The method of claim 1, wherein said first dielectric layer comprises plasma-enhanced chemical vapor deposition (PECVD) oxide.

3. The method of claim 1, wherein said thin film material is silicon-chromium-carbon ($Si_xCr_yC_z$).

4. The method of claim 1, wherein said first metal layer comprises titanium-tungsten (TiW).

5. The method of claim 1, wherein said second dielectric layer comprises plasma-enhanced chemical vapor deposition (PECVD) oxide.

6. The method of claim 1, wherein said second metal layer comprises titanium-tungsten (TiW) and an aluminum-copper alloy.

7. The method of claim 1, wherein said patterning and etching step comprises:

patterning the top plate of said capacitor, wet etching said second metal layer to define said top plate, patterning the bottom plate of said capacitor and the body of said TFR, etching said second dielectric layer, said first layer of metal, and said thin film material to define said bottom plate and the body of said TFR, patterning an active opening for said TFR, and etching said second dielectric layer and said first layer of metal from within said patterned opening to define the length of said TFR.

8. A method of fabricating a thin film resistor (TFR) and a capacitor on a common integrated circuit (IC) substrate, comprising:

depositing a first dielectric layer over existing active device and metal interconnect structures on an IC substrate, depositing a layer of thin film material on said first dielectric layer, depositing a first layer of metal on said thin film material layer, depositing a second dielectric layer over said first layer of metal, depositing a second layer of metal on said second dielectric layer, patterning and etching said first and second layers of metal, said second dielectric layer, and said thin film material layer to form a TFR and a metal-dielectric-metal capacitor on said IC substrate, depositing a third dielectric layer over said TFR and capacitor, etching vias through said third dielectric layer to said TFR and capacitor, and depositing, patterning and etching a third layer of metal to provide metal interconnections to said TFR and capacitor.

9. A method of fabricating a thin film resistor (TFR) and a metal-oxide-metal capacitor (MOMCAP) on a common integrated circuit (IC) substrate, comprising:

fabricating active devices and a metal interconnect level on an IC substrate, depositing a first layer of plasma-enhanced chemical vapor deposition (PECVD) oxide over said active devices and said metal interconnect level, sputter depositing a layer of thin film material on said first PECVD oxide layer, sputter depositing a first layer of metal on said thin film material layer, depositing a second layer of PECVD oxide over said first layer of metal, sputter depositing a second layer of metal on said second PECVD oxide layer, patterning the top plate of a MOMCAP in said second layer of metal, wet etching said second metal layer to define said MOMCAP's top plate, patterning the bottom plate of said MOMCAP and the body of a TFR, etching said second PECVD oxide layer, said first layer of metal, and said thin film material to define said MOMCAP's bottom plate and the body of said TFR, patterning an active opening for said TFR, etching said second PECVD oxide layer and said first layer of metal from within said patterned opening to define the length of said TFR, depositing a third PECVD oxide layer over said TFR and capacitor, etching vias through said third PECVD oxide layer to said TFR and capacitor, and depositing a third layer of metal on said third PECVD oxide layer and patterning and etching said third layer of metal to provide metal interconnections to said TFR and capacitor.

10. The method of claim 9, wherein said thin film material is silicon-chromium-carbon ($Si_xCr_yC_z$).

11. The method of claim 9, wherein said first metal layer comprises titanium-tungsten (TiW).

12. The method of claim 9, wherein said second metal layer comprises a titanium-tungsten (TiW) layer and an aluminum-copper (Al—Cu) alloy layer.

13. The method of claim 12, wherein said TiW layer of said second metal layer has a thickness of between 500–3000 Å and said Al—Cu alloy layer has a thickness of between 1000–7000 Å.

14. The method of claim 9, wherein said first PECVD oxide layer has a thickness of between 1000–6000 Å.

15. The method of claim 9, wherein said first metal layer has a thickness of between 500–3000 Å.

16. The method of claim 9, wherein said second PECVD oxide layer has a thickness of between 200–1500 Å.

17. The method of claim 9, wherein said etching to define said MOMCAP's bottom plate and the body of said TFR is accomplished with a single dry etch tool.

18. The method of claim 9, wherein said etching to define said MOMCAP's bottom plate and the body of said TFR comprises:

dry etching said bottom plate with a standard $CF_4/CHF_3$ dry plasma etch, etching said bottom plate's TiW in hot $H_2O_2$, and dry etching said thin film material in standard $Cl_2$ and $O_2$ chemistry.

19. The method of claim 9, wherein said etching to define said MOMCAP's bottom plate and the body of said TFR comprises:

dry etching said bottom plate with a standard $CF_4/CHF_3$ dry plasma etch, etching said bottom plate's TiW in hot $H_2O_2$, and dry etching said thin film material in standard $SF_6$ chemistry.

20. The method of claim 9, wherein said etching said second PECVD oxide layer and said first layer of metal from within said patterned opening to define the length of said TFR comprises:

dry etching said second PECVD oxide layer with a standard $CF_4/CHF_3$ dry plasma etch, and etching said first layer of metal in hot $H_2O_2$.

21. The method of claim 9, further comprising planarizing said third PECVD oxide using a spin-on glass etch back step.

22. The method of claim 9, further comprising planarizing said third PECVD oxide layer using chemical-mechanical polishing (CMP).

23. A method of fabricating a thin film resistor (TFR) and a metal-dielectric-metal capacitor on a common integrated circuit (IC) substrate, comprising:

fabricating active devices and a metal interconnect level on an IC substrate, depositing a first dielectric layer over said active devices and said metal interconnect level, depositing a layer of thin film material on said first dielectric layer, patterning and etching said thin film layer to define the body of a TFR, depositing a first layer of metal on said TFR body and said first dielectric layer, depositing a second dielectric layer over said first layer of metal, depositing a second layer of metal on said second dielectric layer, patterning and etching the top plate of a capacitor from said second layer of metal, patterning and etching the bottom plate of said capacitor and an active opening for said TFR, depositing a third dielectric layer over said TFR and capacitor, etching vias through said third dielectric layer to said TFR and capacitor, and depositing a third layer of metal on said third dielectric layer and patterning and etching said third layer of metal to provide metal interconnections to said TFR and capacitor.

24. The method of claim 23, wherein said second dielectric layer is plasma-enhanced chemical vapor deposition (PECVD) oxide and said etching of said PECVD oxide layer and said first layer of metal to define said bottom plate and said active opening comprises:

performing a standard $CF_4/CHF_3$ dry plasma etch, and performing a wet etch in hot $H_2O_2$.

25. A method of fabricating a thin film resistor (TFR) and a metal-dielectric-metal capacitor on a common integrated circuit (IC) substrate, comprising:

fabricating active devices and a metal interconnect level on an IC substrate, depositing a first dielectric layer over said active devices and said metal interconnect level, depositing a layer of thin film material on said first dielectric layer, depositing a first layer of metal on said thin film material layer, depositing a second dielectric layer over said first layer of metal, patterning and etching the bottom plate of a capacitor and the body of a TFR from said first layer of metal and said second dielectric layer, patterning and etching an active opening for said TFR from said first layer of metal and said second dielectric layer, depositing a second layer of metal on said second dielectric layer, patterning and etching the top plate of said capacitor from said second layer of metal, depositing a third dielectric layer over said TFR and capacitor, etching vias through said third dielectric layer to said TFR and capacitor, and depositing a third layer of metal on said third dielectric layer and patterning and etching said third layer of metal to provide metal interconnections to said TFR and capacitor.

26. A method of fabricating a thin film resistor (TFR) and a metal-dielectric-metal capacitor on a common integrated circuit (IC) substrate, comprising:

fabricating active devices and a metal interconnect layer on an IC substrate, depositing a first dielectric layer over said active devices and said metal interconnect level, depositing a layer of thin film material on said first dielectric level, patterning and etching said thin film layer to define the body of a TFR, depositing a first layer of metal on said TFR body and said first dielectric layer, depositing a second dielectric layer over said first layer of metal, patterning and etching the bottom plate of a capacitor and an active opening for said TFR from said second dielectric layer and said first metal layer, depositing a second layer of metal, patterning and etching the top plate of said capacitor from said second layer of metal, depositing a third dielectric layer over said TFR and capacitor, etching vias through said third dielectric layer to said TFR and capacitor, and depositing a third layer of metal on said third dielectric layer and patterning and etching said third layer of metal to provide metal interconnections to said TFR and capacitor.

* * * * *